United States Patent [19]

Delage et al.

[11] Patent Number: 5,411,632

[45] Date of Patent: May 2, 1995

[54] METHOD FOR THE ETCHING OF A HETEROSTRUCTURE OF MATERIALS OF THE III-V GROUP

[75] Inventors: Sylvain Delage, Grieres; Hervé Blanck, Arcueil; Simone Cassette, Limours, all of France

[73] Assignee: Thomson-CSF, Puteaux, France

[21] Appl. No.: 147,482

[22] Filed: Nov. 5, 1993

[30] Foreign Application Priority Data

Nov. 6, 1992 [FR] France .................. 92 13400

[51] Int. Cl.$^6$ .......................................... H01L 21/00
[52] U.S. Cl. ........................ 156/652.1; 156/643.1; 156/662.1; 156/656.1; 156/646.1; 156/649.1; 437/909
[58] Field of Search .............. 156/643, 662, 656, 652, 156/646, 649; 437/909

[56] References Cited

U.S. PATENT DOCUMENTS

| | | | |
|---|---|---|---|
| 4,661,961 | 4/1987 | Nelson et al. | 372/46 |
| 5,021,361 | 6/1991 | Kinoshita et al. | 437/129 |
| 5,034,092 | 7/1991 | Lebby et al. | 156/643 |
| 5,111,265 | 5/1992 | Tanaka | 357/34 |
| 5,330,932 | 7/1994 | Liu et al. | 437/133 |

FOREIGN PATENT DOCUMENTS 0408252  1/1991  European Pat. Off. .
0480803  4/1992  European Pat. Off. .

OTHER PUBLICATIONS

Proceeding of the Inter. Electron Devices Meeting 1987, Dec. 6, 1987, pp. 852–853, H. Schumacher, et al., "OMCVD Grown InP/InGaAs Heterojunction Bipolar Transistors".

IEEE Electron Device Letters, vol. EDL-7, No. 6, Jun. 1986, pp. 359–362, R. Fischer, et al., "Reduction of Extrinsic Base Resistance in GaAs/AlGaAs Heterojunction Bipolar Transistors and Correlation with High-Frequency Performance".

Applied Physics Letters, vol. 53, No. 11, Sep. 12, 1988 pp. 983–985, W. T. Tsang, et al., "GaInAs/GaInAsP-/InP Heterostructure Bipolar Transistors with Very Thin Base (150 A) Grown by Chemical Beam Epitaxy".

Primary Examiner—R. Bruce Breneman
Assistant Examiner—George Goudreau
Attorney, Agent, or Firm—Oblon, Spivak, McClelland, Maier & Neustadt

[57] ABSTRACT

Disclosed is a method for the etching of at least two layers of semiconductor materials having different natures, with a view to making a mesa for the self-alignment of the metallizations of a transistor. The heterojunction must comprise a first layer of a material containing As, which is etched by reactive ion etching, and a second layer of a material containing P which is etched chemically. Application to the making of HBT type vertical heterojunction transistors.

7 Claims, 2 Drawing Sheets

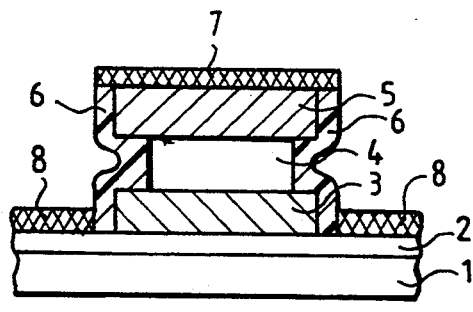
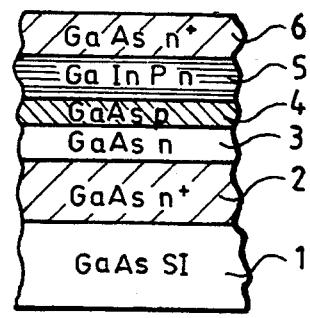
FIG.1            FIG.2
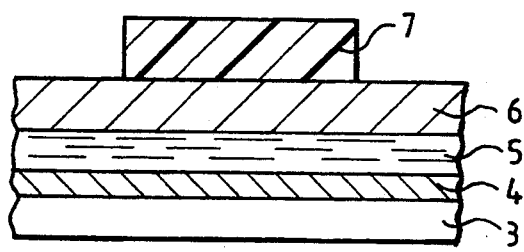
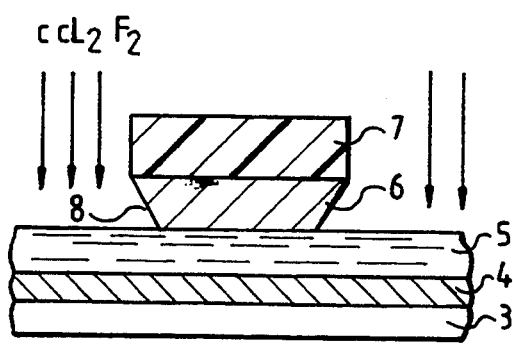
FIG.3            FIG.4
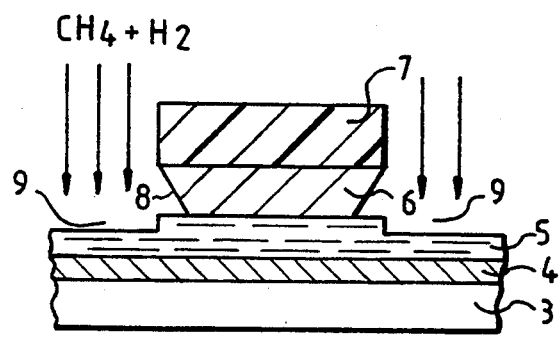
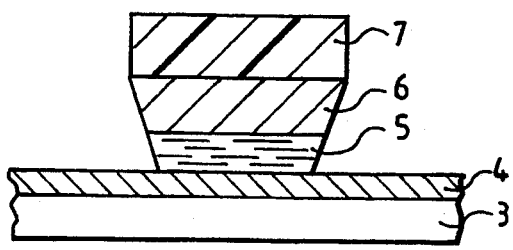
FIG.5            FIG.6

METHOD FOR THE ETCHING OF A HETEROSTRUCTURE OF MATERIALS OF THE III-V GROUP

BACKGROUND OF THE INVENTION

1. Field of the Invention

The present invention relates to a method for the making of the metallizations of a transistor with a vertical structure, having a raised pattern called a mesa: the deposition of the metallizations on and around the mesa should not touch the vertical flanks of the pattern so as to prevent short-circuiting because of unwanted deposits.

The method according to the invention can be applied preferably to vertical components of the III—V group and, more particularly, to heterojunction bipolar transistors (HBTs) in which the current is conveyed perpendicularly to the surface of the substrate: there is therefore at least one access electrode metallization (the emitter) on the mesa and one control electrode metallization (the base) at the foot of the mesa, the second access metallization (the collector) being in a third plane, either on the back of the substrate or at the bottom of an etching. To enable these transistors, which are designed for the microwave frequencies, to work efficiently, it is necessary to:

reduce the surface area of the base-collector junction to the maximum;

prevent short-circuits between the emitter and the base;

limit the interaction between the base of the transistor and the hydrogen coming from the etching plasma.

There are certain field-effect transistors, for example SISFETs (Semiconductor-Insulator-Semiconductor Field Effect Transistors) which, although the current therein flows in parallel to the surface of the substrate, may be considered to be vertical components inasmuch as they comprise an etched semiconductor pattern used to self-align two metallizations with respect to each other.

Furthermore, the method according to the invention is designed more particularly for power transistors in which the working temperature can reach 200° C., which therefore means that the device should have very high thermal stability.

2. Description of the Prior Art

A method for the making of the metallizations of an HBT type vertical transistor is already described in the French patent application No. 90 12442, filed on 9th October by the present Applicant and corresponds to U.S. Pat. No. 5,194,403. This method is recalled briefly by means of FIG. 1.

The transistor described in this figure comprises:
an n doped substrate 1 used as a collector;
a p+ doped layer 2 which constitutes the base;
an n doped layer 3, which is the emitter, covered with an n+ doped layer 4 to improve the ohmic contact with the emitter metallization 5.

The materials of these layers are all of the III—V group but those of the two layers 3 and 4 (GaInP for the layer 3 and GaAs for the layer 4 for example) are chosen so as to show a different reaction to two different etching methods: for example, the etching of the mesa 3+4+5 is done by a first reactive ion etching or RIE of chlorinated compounds in the presence of helium while a second RIE by methane in the presence of hydrogen creates a sub-etching of the contact layer 4 beneath the metallization 5.

The whole piece is covered with a layer 6+7+8 pf a dielectric, the parts 6 of which have a cavity that penetrates the sub-etching of the layer 4. This cavity will subsequently interrupt the parasitic metallizations that get deposited on the flanks of the mesa and that short-circuit the emitter and the base. A third ion etching with sulphur hexafluoride is used to eliminate the parts 7 and 8 of the dielectric which are deposited at the location of the emitter and base metallizations: an evaporation of metals will deposit the base contact at 8 and reinforce the emitter contact at 7.

This method is effective, but uses three operations of reactive ion etching: a more promising approach to the industrial-scale manufacture of HBT type transistors lies in implementing technological means that are simpler, less expensive and therefore more economical for the final product.

SUMMARY OF THE INVENTION

The method according to the invention uses a specific electrochemical phenomenon which makes it necessary for a layer of semiconductor material to contain phosphorus, for example in GaInP, and for another underlying layer to contain arsenic, for example in GaAs.

The chemical corrosion or etching of the layer containing P by means of an acid solution is stopped by the layer containing As. This chemical etching is possible only after it has been initiated by means of a slight ion etching of the upper surface of the layer containing P, owing to interdiffusions which are such that the physical/chemical properties of said surface do not allow direct chemical etching.

More specifically, the invention relates to a method for the etching of a heterostructure of layers of group III—V semiconductor materials, for the making of a heterojunction transistor, wherein the heterojunction comprises at least one first layer of a compound containing arsenic (such as GaAs, AlGaAs etc.) which is etched by a first reactive ion etching, and a second layer of a compound comprising phosphorus (such as InP, GaInP etc.) which is etched by an aqueous solution of hydrochloric acid (HCl).

BRIEF DESCRIPTION OF THE DRAWINGS

The invention will be understood more clearly from the following description of an exemplary application, made with reference to the appended figures of which:

FIG. 1 shows a schematic diagram of a method according to the prior art, as explained here above, FIGS. 2 to 9 show different steps of the method according to the invention.

MORE DETAILED DESCRIPTION

Figure 7:
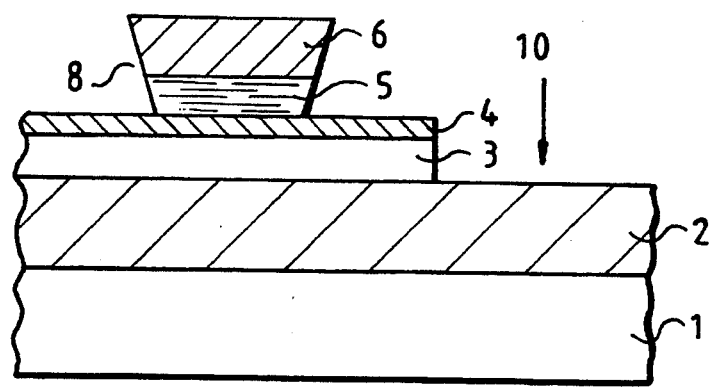

The invention will be described more easily by means of the example of a vertical HBT type npn transistor associating the pair of materials GaInP/GaAs, but this example in no way limits the scope of the invention: one of the two materials must contain P (InP, GaP, ...) and the other material must contain As (GaInAs, GaAlAs, ...) so as to create a pair of materials that react differently with respect to a pair of etching procedures.

FIG. 2 shows a sectional view of the initial epitaxial structure in which an HBT will be made. This structure comprises for example:

a substrate 1 made of semi-insulator GaAs;

a sub-collector 2 made of GaAs with high n type doping;

a collector 3 made of GaAs with medium n doping;

a base 4 of p+ doped GaAs having a thickness of 30 to 120 nm;

an emitter 5 made of n doped GaInP;

a contact layer 6 made of highly n+ doped GaAs, capable of containing GaInAs.

With a view to their simplification, the following figures (3 to 6) do not show the substrate 1 and the sub-collector 2 if their presence is not necessary for an understanding of the invention.

The first technological step (FIG. 3) consists in making a virtual emitter 7. This mask may be made:

either with a nitride type or photosensitive polymer type insulator, or with a conductor material such as germanium, titanium, or an alloy of Au—Ge/Ni/Au.

The value of this approach is that it enables the use of techniques for the direct etching of the mask, or else the use of a lift-off type technique.

The second step shown in FIG. 4 consists of the dry etching of the GaAs of the n+ GaAs of the contact layer 6, this etching being done anisotropically and selectively with respect to the GaInP of the emitter layer 5. It is furthermore possible to create a slight lateral sub-etching 8 that prevents any risk of subsequent metal deposits on the flanks of the pattern 6+7 by prolonging the etching process. For the pair of materials GaAs/GaInP, the selective ion etching of GaAs is done, for example, by using the reactive gases $CCl_2F_2$ or $SiCl_4$: this enables a degree of selectivity that is almost infinite when compared with GaInP and provides for a very precise degree of control over the lateral etching.

The following steps are shown partly in FIG. 5 and partly in FIG. 6: they consist in etching the layer 5 of the GaInP emitter by self-alignment on the contact-making pattern 6 made of GaAs. The hydrochloric acid corrodes the GaInP heavily but does not affect the GaAs.

But in fact, after the reactive ion etching, the interface of the layers 5/6 of GaInPs/GaAs have physical/chemical properties that are poorly known and that sometimes do not enable the direct corrosion of GaInP by HCl. It is thought that there may sometimes be inter-diffusions between these two layers. This is why it is perhaps necessary to eliminate firstly (FIG. 5) a surface film 9 in the GaInP layer 5 by reactive ion etching with $CH_4$ and $H_2$ or by ion bombardment, on a thickness of about 100 nm. The etching selectivity (of the order of 4) of GaInP by $CH_4+H_2$ as compared with GaAs makes it possible to minimize the risks of corrosion of the base 4. Furthermore, the partial corrosion of GaInP by $CH_4+H_2$ averts the problems of passivation of the base 4 by the atomic hydrogen coming from the plasma.

After this cleaning of the surface of the GaInP layer 5, it is then possible to carry out the proper etching of the emitter, by the dissolving of GaInP in an aqueous solution of hydrochloric acid which does not corrode GaAs. FIG. 6 shows the product at the end of this step: the etching by HCl does not modify the contact layer 6 which is made of n+ GaAs, and it abuts the base layer 4 which is also made of p+ GaAs. By contrast, this corrosion process has sub-etched the emitter layer 5 which is self-aligned on the contact layer 6.

The process of selective chemical corrosion by HCl reveals crystalline planes that must be taken into account during the implantation of a circuit on the epitaxiated wafer of FIG. 2.

The fifth step, which is not shown, consists in removing the etching mask 7, which has been used as a virtual emitter for the self-alignment. This can be done by a wet process or a dry process, and selectively, by one of the many means known to those skilled in the art.

The emitter and base metallizations can now be deposited respectively on the layers 6 and 4, but it is necessary first of all to add a collector and, possibly, insulating wells to the transistor. In figure 7, the base layer 4 and collector layer 3 are etched by a dry or wet process in a region 10 close to the foot of the mesa 5+6. It is in this region 10 that the collector metallization will be deposited, on the layer 2 with very high n+ doping. But if the substrate 1 is doped instead of being a semi-insulator substrate, the collector metallization can be borne by the rear face of the substrate 1 and the lateral etching of the layers 3 and 4 is no longer necessary: this variant does not depart from the field of the invention.

Figure 8:
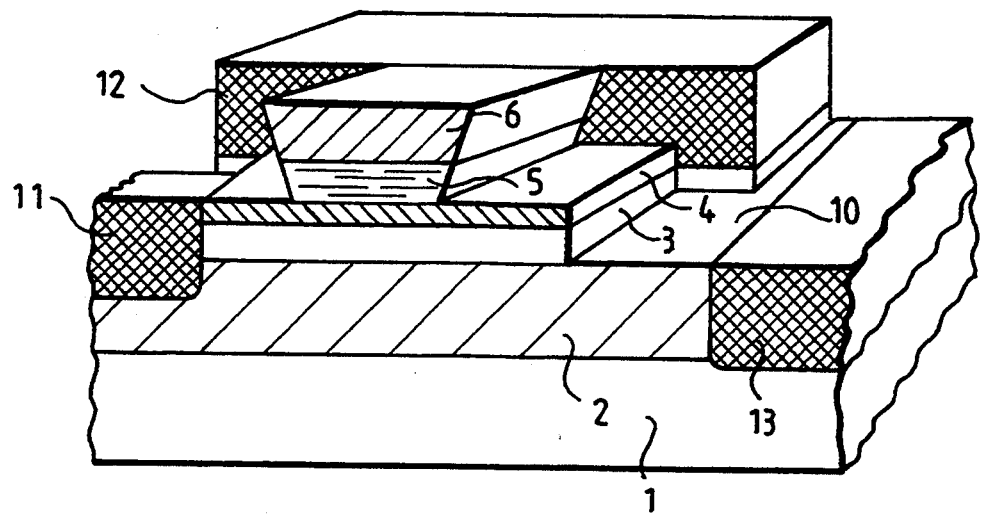

The seventh step consists in carrying out the electrical insulator ion implantation in the different parts of the device in order to enable the reduction of the different parasites that are detrimental to the microwave performance characteristics of the component, especially under the future emitter and base contacts connection by air bridges. FIG. 8, which is a view in perspective, shows that a part of the layers 2+3+4 at the foot of the mesa 5+6 is given insulator qualities by implantation and forms a insulating well 11, implanted where necessary to insulate the transistor from its neighbors.

This same FIG. 8 shows that the mesa of the emitter is actually in the shape of a T, one part of which is implanted: it is this part that will bear the emitter metallization in the region where it receives an air bridge.

Furthermore, it is possible to make the material of the sub-collector 2 between the components semi-insulating by the implantation of insulating wells such as 13. This makes it possible both to limit the step to be spanned by the air bridges and to eliminate the etching step.

Figure 9:
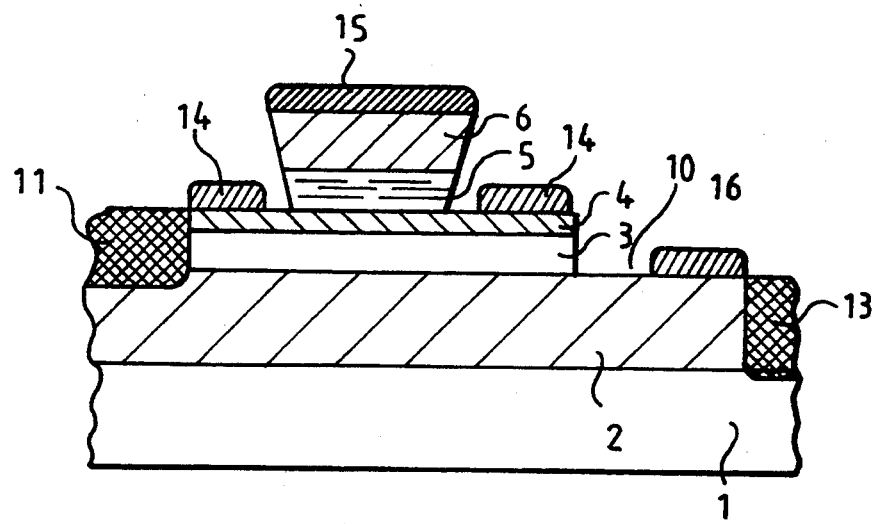

The last step consists in making the emitter, base and collector ohmic contacts. In the case of the base layer 4 made of p+ type GaAs, the ohmic contact 14 (FIG. 9) can be made in an excellent way by means of unalloyed contacts. The presence of n+ GaInAs in the layer 6 also enables the making of n type ohmic contacts of satisfactory quality without any alloy. It is therefore easy, in this case, in a single step, to make the ohmic contact of the emitter at 15 and that of the base at 14 either by means of completely refractory materials (W, Mo, TiWSi) or by using more standard unalloyed contacts that contain gold or other metals known for their high electrical resistivity (Al for example): such contacts may be of the Ti/Pt/Au, Ti/Au, Ti/Al, Mo/Au and other types. The possibility of using refractory materials, or combinations of refractory metals or metals such as gold and aluminium makes it possible, at the same time, to obtain contacts that are thermally perfectly stable and to avoid having recourse to lift-off techniques.

In the case of structures of specific materials, the collector contact 16 may be made at the same time by using the same metal deposit or else, if an unalloyed contact proves to be difficult to make, by using a more standard type of alloyed contact based on gold, germanium or nickel for example.

The present invention, relying essentially on the properties of the GaInP/GaAs heterostructure, has all the advantages of self-alignment but also enables the following to be achieved all at the same time:

- controlling the geometry of the emitter determined by lithography and by a precise, anisotropic dry etching;
- limiting the risks of electrical passivation of the dopants of the base by the atomic hydrogen generated by the etching plasmas;
- limiting the annealing operations needed for the reactivation of the dopant of the base after an RIE containing atomic hydrogen;
- optimizing the access resistance of the emitter;
- controlling the stopping of the corrosion on the base to within few atomic layers;
- giving the insulator a role closer to electrical passivation than that of the side-wall which makes it necessary to combine the functions of passivation, insulation and resistance to acids; and furthermore makes it possible to:
- eliminate a critical step of the lift-off type (thus providing an improvement in methods);
- carry out the etching of the mesa of the emitter by using a non-metallic mask (thus reducing the rate of defects on the wafer and hence improving manufacturing productivity);
- use metallizations made of refractory materials (thus obtaining thermal stability and an improvement in reliability);
- make, in only one step, the ohmic contacts of the emitter and of the base and, potentially, that of the collector (thus reducing of the number of steps and, hence, reducing manufacturing costs and risks related to handling).

The method according to the invention has been explained with reference to the example of the pair of materials GaInP/GaAs: it is more generally applicable to other pairs of materials of which one contains phosphorus while the other contains arsenic.

This method can also be applied to transistors other than HBT type transistors. It is specified by the following claims.

What is claimed is:

1. A method for the etching of a heterostructure of layers of group III-V semiconductor materials, for the making of a heterojunction transistor, said method being one wherein the heterojunction comprises at least one first layer of a compound containing arsenic (such as GaAs, AlGaAs etc.) which is etched by a first reactive ion etching, and a second layer of a compound containing phosphorus (such as InP, GaInP etc.) which is etched by an aqueous solution of hydrochloric acid (HCl);

wherein the chemical corrosion, by HCl, of the second layer is preceded by a cleansing of the surface by means of a second reactive ion etching localized on a thickness of the order of 100 angstroms, this cleansing being made necessary by the presence of interdiffusions at the interface of the first and second layers.

2. A method of etching according to claim 1, wherein the first layer is etched by a plasma of $CCl_2F_2$ or SiCl.

3. A method of etching according to claim 1, wherein the second layer is partially etched with a plasma of $CH_4+H_2$ or by ion bombardment.

4. A method of forming a heterostructure of layers of group III-V semiconductor material comprising the steps of:

creating a structure having a first layer which serves as a mask, a second layer, under the first layer, including a compound containing arsenic, and a third layer, under the second layer, including a compound containing phosphorous;

etching the second layer using a reactive ion etching such that the first layer serves as a protective layer and the reactive ion etching reduces: a cross-section area of the second layer as a distance from the first layer increases;

etching the third layer by an aqueous solution of hydrochloric acid such that as a distance from the second layer increases, a cross-sectional area of the third layer decreases.

5. A method according to claim 4, wherein after etching of the second layer and before the etching of the third layer, there is a step of:

a second reactive ion etching to cleanse interdiffusions at the third layer.

6. A method according to claim 4, wherein the second layer is etched by plasma of $CCl_2F_2$ or $SiCl_4$.

7. A method according to claim 5, wherein the third layer is partially etched with a plasma of $CH_4+H_2$ or by ion bombardment.

* * * * *